United States Patent
Chen

(10) Patent No.: US 7,719,027 B2
(45) Date of Patent: May 18, 2010

(54) INTERGRATED CIRCUIT UTILIZING DOWN BOND TO DEFINE THE FUNCTION OF THE DIE AND THE IMPLEMENTING METHOD THEREOF

(75) Inventor: ShouFang Chen, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 496 days.

(21) Appl. No.: 11/625,810

(22) Filed: Jan. 22, 2007

(65) Prior Publication Data
US 2008/0029908 A1    Feb. 7, 2008

(30) Foreign Application Priority Data
Aug. 3, 2006    (TW) .............................. 95128445 A

(51) Int. Cl.
*H01L 31/111* (2006.01)
*H01L 21/336* (2006.01)

(52) U.S. Cl. .................... 257/177; 257/678; 257/698; 257/777; 257/784; 257/E23.031; 257/E23.034; 257/E23.047; 257/E23.062; 438/123; 438/286

(58) Field of Classification Search ............... 257/177, 257/698, 777, 784, E23.031, E23.034, E23.047, 257/E23.062; 438/123, 286; *H01L 31/111, H01L 21/336, 29/76*
See application file for complete search history.

(56) References Cited

U.S. PATENT DOCUMENTS

| 2006/0097380 A1* | 5/2006 | Sato ........................... 257/706 |
| 2006/0263988 A1* | 11/2006 | Takahashi et al. ........... 438/286 |
| 2007/0262346 A1* | 11/2007 | Otremba et al. ............. 257/177 |

FOREIGN PATENT DOCUMENTS

TW    I244180    11/2005

\* cited by examiner

*Primary Examiner*—Dao H Nguyen
(74) *Attorney, Agent, or Firm*—Winston Hsu

(57) ABSTRACT

The present invention provides an integrated circuit and the method of implementing the same. The integrated circuit includes a die, a base, a covering material and a plurality of pins. The die has at least a first function and a second function and includes a plurality of signal pads and at least a switching pad. The die receives and outputs signals through the signal pads, and the switching pad is utilized to switch the functions of the die. The base is utilized to support the die, and the covering material is utilized to cover the die and the base. One terminal of each pin is inside the covering material and coupled to the corresponding signal pad, and the other terminal of each pin is outside the covering material. The signal pads are connected to the circuits outside the integrate circuit through the pins.

4 Claims, 4 Drawing Sheets

INTERGRATED CIRCUIT UTILIZING DOWN BOND TO DEFINE THE FUNCTION OF THE DIE AND THE IMPLEMENTING METHOD THEREOF

BACKGROUND OF INVENTION

1. Field of the Invention

The present invention relates to an integrated circuit and an implementing method thereof, especially to an integrated circuit utilizing down bond to define the functions of a die and an implementing method thereof.

2. Description of the Prior Art

Referring to FIG. 1, a top view of a semiconductor die is shown. The die 100 utilizes complicated interior circuits to implement desired functions. The die 100 has a plurality of pads 111~122 on the surface thereof for connecting to the interior circuits, such that the die 100 can receives and outputs signals through the pads 111~122. Meanwhile, a certain pad of the die 100 is used to define the functions of the die 100; for example, if the pad 116 is connected to a low voltage level, then the die 100 performs a first function accordingly, or if the pad 116 is connected to a high voltage level, the die 100 performs a second function different from the first function. That is, the function performed by the die 100 can be defined by inputting different signals to the pad 116, or the so-called switching pad.

Referring to FIG. 2, a side view of an integrated circuit (IC) is shown. The IC 200 includes the die 100, a covering material 210, a base 220, pins 230, 240, and interior wires 250, 260. The base 220 is for supporting the die 100, and the pads 116, 117 are connected to the pins 240, 230 through the interior wires 260, 250 respectively, such that the die 100 can communicate with external circuits outside the IC 200 through the pins 230, 240. As shown in FIG. 1, in addition to pads 116 and 117, the die 100 further includes other pads like pads 111~115 and 118~122 which are connected to other corresponding pins through other interior wires respectively. The covering material 210 covers the die 100, the base 220, the interior wires 250, 260, and the upper portions of the pins 230, 240. The lower portions of the pins 230, 240 are outside the covering material 210. In some application cases, part of the pads 111~122 are used to input and output signals; while others are used to receive a control signal, such that the die 100 performs a desired function according to the control signal. For example, when the die 100 has several functions which are switched according to the control signal, and the pad 116 which connects to the external circuits via the pin 240 is the switching pad for receiving the control signal, then the control signal can be inputted to the pad 116 through the pin 240 to define the function of the die 100. In general, when the pad 116 receives low or high voltage levels, the die 100 performs different functions accordingly. In addition, once the application circuit of the die 100 is determined, the desired function of the die 100 is hardly changed, that is, the pin 240 would be connected to a constant pre-determined voltage level. However, the number of the pins is the key to the IC packaging cost, so the reduction of the manufacturing cost of the IC 200 can be achieved by decreasing the number of pins.

SUMMARY OF INVENTION

It is therefore a primary objective of the claimed invention to provide an integrated circuit utilizing down bond to define the function of the die and the implementing method thereof.

According to an embodiment of the claimed invention, an integrated circuit using down bond to define functions of a die is disclosed. The integrated circuit includes a die, a base, a covering material and a plurality of pins. The die has at least a first function and a second function and includes a plurality of signal pads and at least a switching pad. The die receives and outputs signals through the signal pads, and the switching pad is utilized to switch the functions of the die. The base is utilized to support the die, and the covering material is utilized to cover the die and the base. One terminal of each pin is inside the covering material and coupled to the corresponding signal pad, and the other terminal of each pin is outside the covering material. The signal pads are connected to the circuits outside the integrate circuit through the pins.

According to another embodiment of the claimed invention, a method of implementing an integrated circuit is disclosed. The method includes: providing a base; supporting a die by utilizing the base, wherein the die, which has at least a first function and a second function, includes a plurality of signal pads and at least a switching pad, and receives and outputs signals through the signal pads, and the switching pad is for switching the functions of the die; coupling the signal pads to a plurality of pins, wherein one terminal of each pin is coupled to the corresponding signal pad, and the signal pads are connected to the circuits outside the integrated circuit through the pins; covering the base, the die, and the terminals of the pins coupled to the signal pads with a covering material, such that the other terminal of each pin is outside the covering material.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
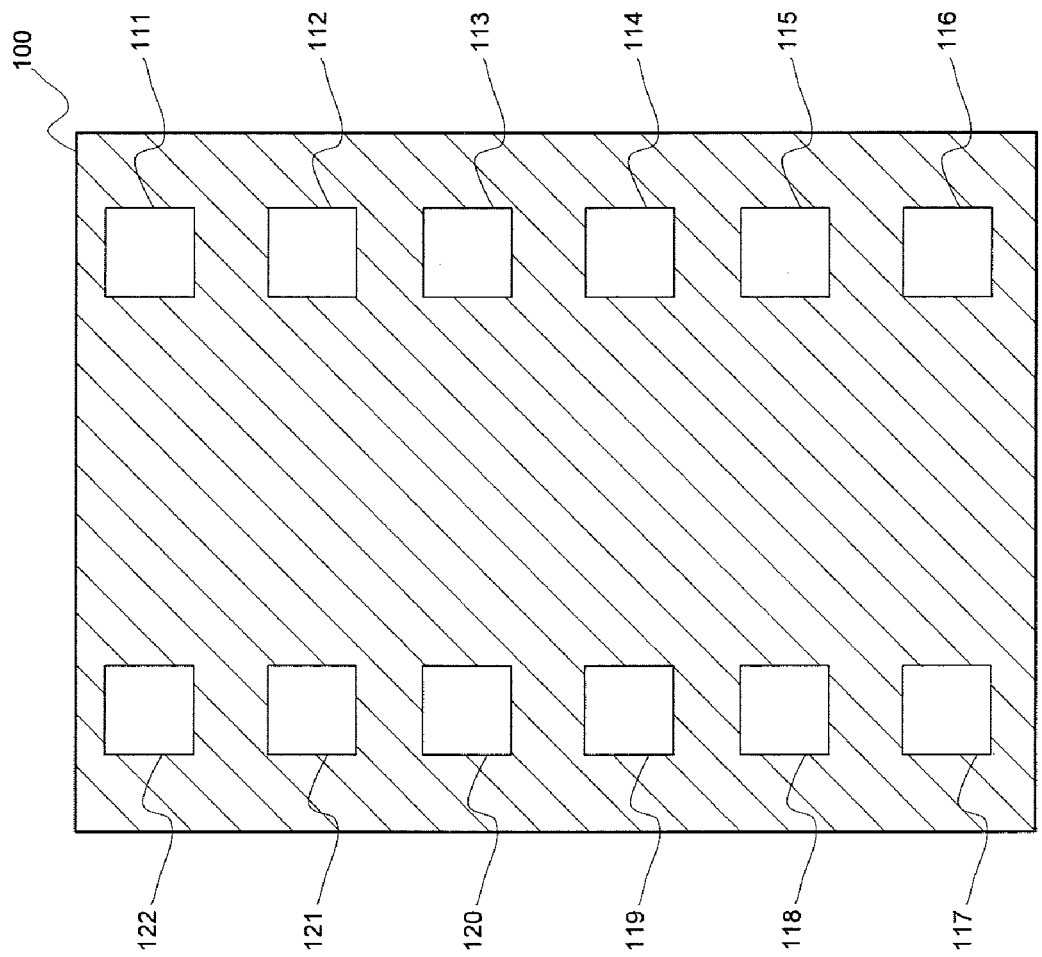
FIG. 1 is a top view of a semiconductor die.
Figure 2:
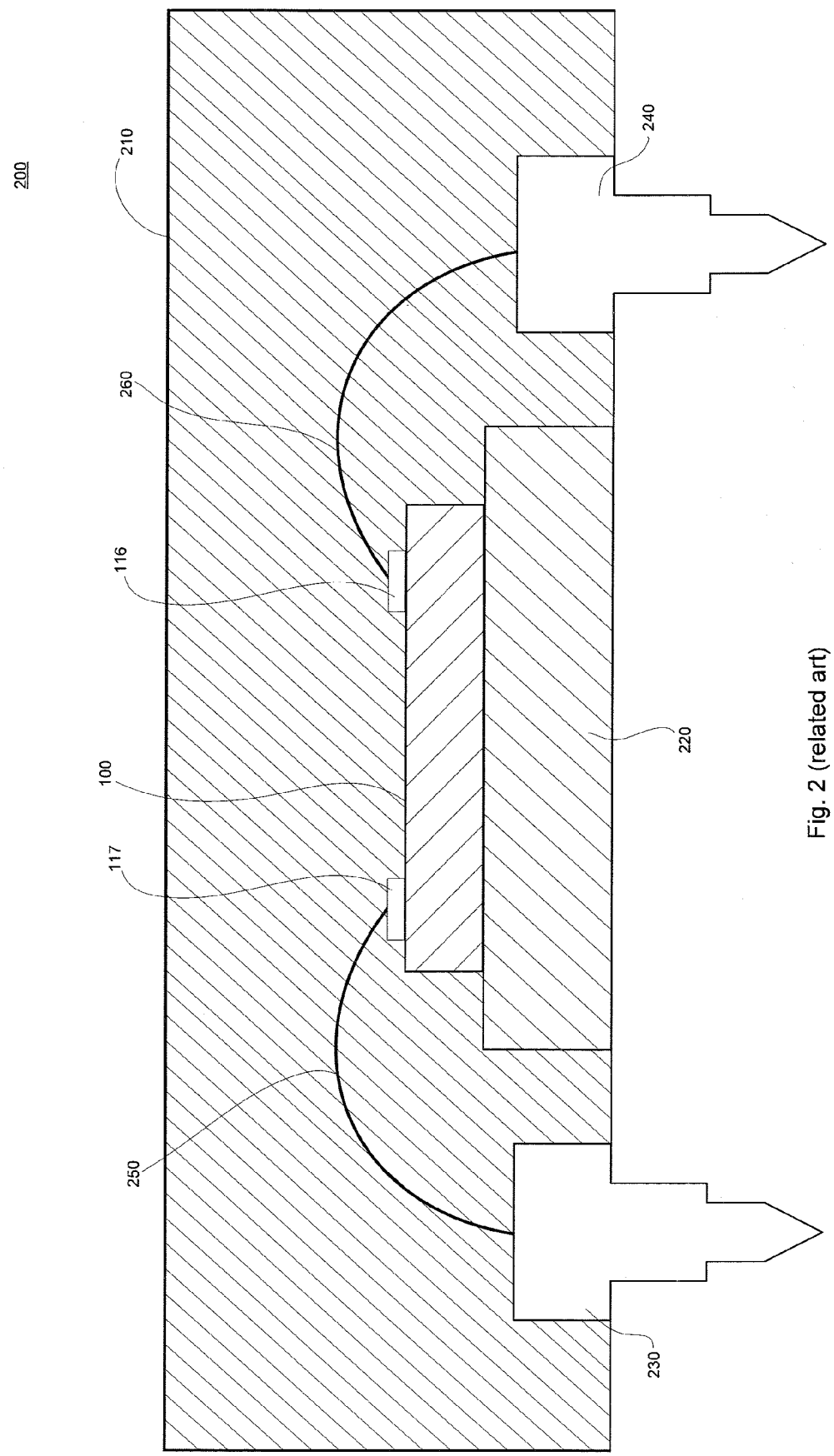
FIG. 2 is a side view of an integrated circuit.
Figure 3:
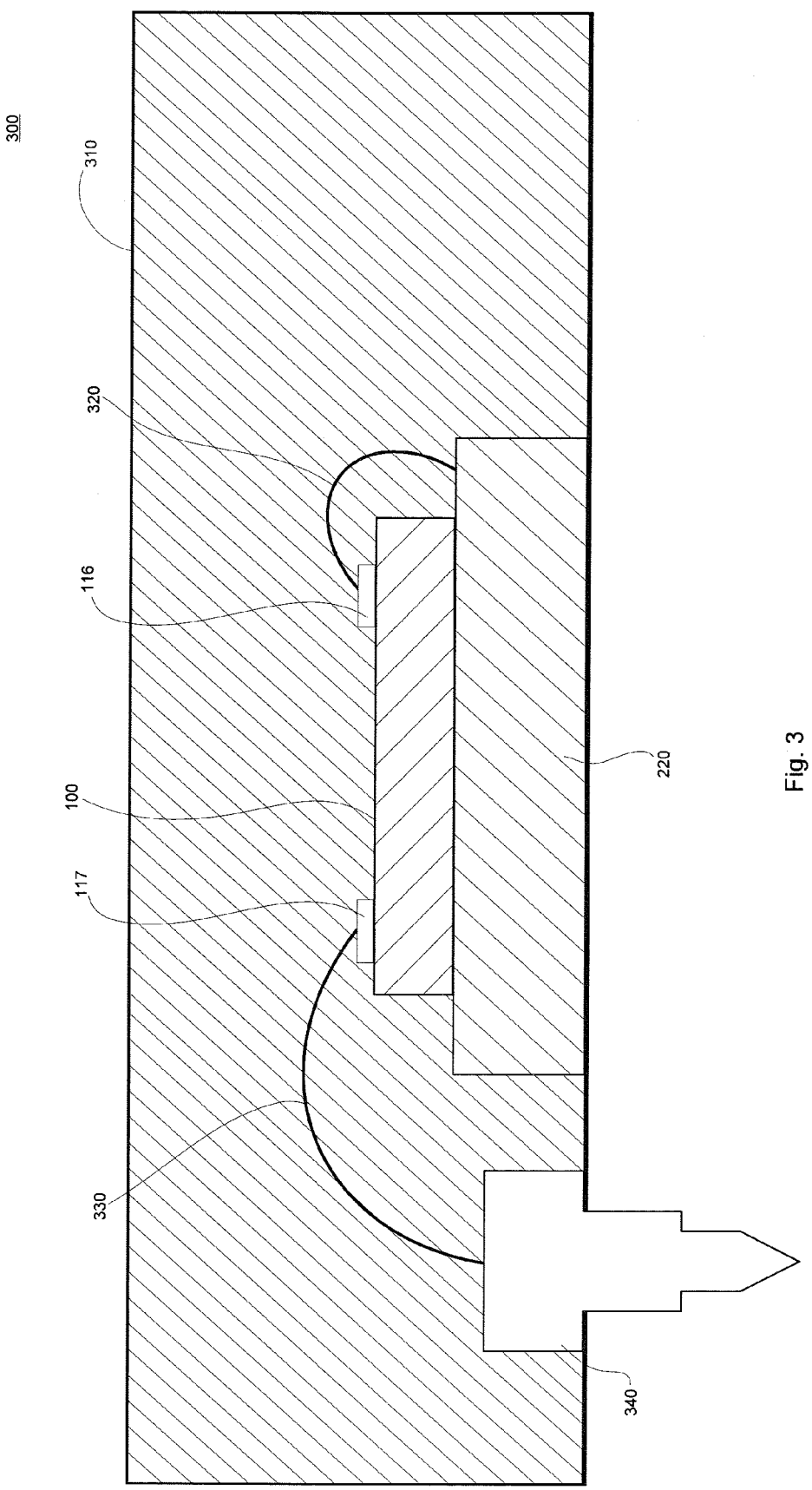
FIG. 3 is a side view of an integrated circuit according to a first embodiment of the present invention.

Referring to FIG. 3, a side view of an integrated circuit is shown according to a first embodiment of the present invention. The integrated circuit 300 includes a die 100, a covering material 310, a base 220, a pin 340, an interior wire 330, and a down bond wire 320. The die 100 disposed on the base 220 has at least a first function and a second function. The pads 111~115 and 117~122 are the signal pads for receiving and outputting signals, and the pad 116 is the switching pad for receiving the control signal to define the function of the die 100. As shown in FIG. 3, the signal pad 117 is connected to the pin 340 of the IC 300 through the interior wire 330, and thereby the signal pad 117 outputs signals generated by the die 100 or receives signals from external circuits via the pin 340. The pads 111~115 and 118~122 are also connected to other pins through other interior wires respectively. The pad 116 is connected to the base 220 through the down bond wire 320, and therefore the pad 116 is effectively coupled to ground, which is an equivalent effect of making the pad 116 receive a low voltage level. That is, the pad 116 receives the control signal with a low voltage level directly without being connected to any pin, and therefore the die 100 will perform the first function accordingly. When the desired function of the integrated circuit 300 is determined, the pad 116 can be connected to the base 220 through the down-bond wire 320 to define the function of the die 100, such that the cost of the integrated circuit 300 is decreased due to the reduction in the number of the pins. The covering material 310 covers the die 100, the base 220, the interior wire 330, the down-bond wire 320, and the upper portion of the pin 340. The lower portion of the pin 340 is outside the covering material 310. In an preferred embodiment of the present invention, the covering material 310 is a thermoplastics seal or a plastic shell.

Figure 4:
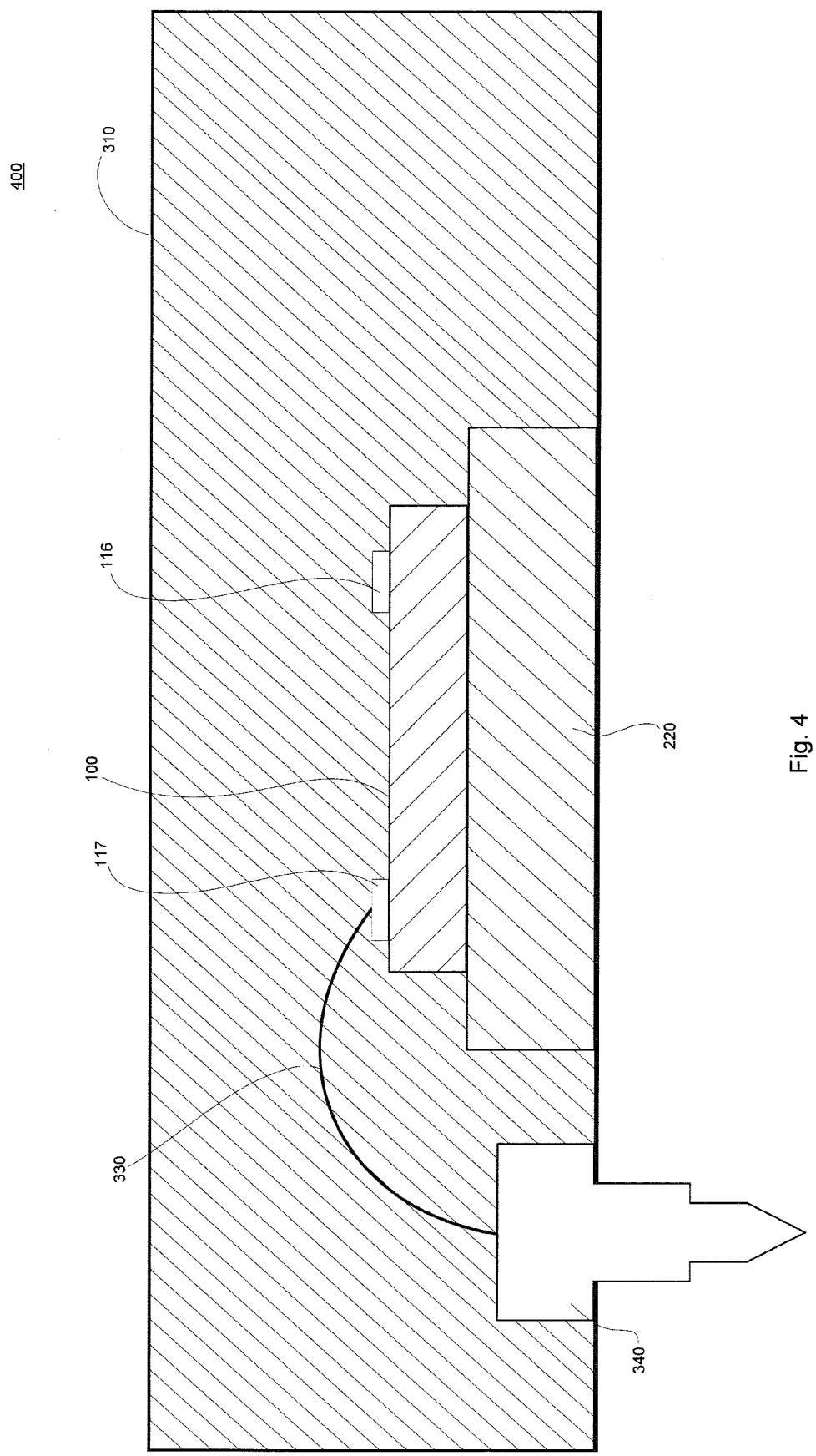
FIG. 4 is a side view of and integrated circuit according to a second embodiment of the present invention.

Referring to FIG. 4, a side view of an integrated circuit according to a second embodiment of the present invention is shown. In the integrated circuit 400, the pad 116 of the die 100 is not connected to the base 220 or any pin, and therefore the voltage level on the pad 116 is effectively high, causing the die 100 to operate the second function.

In summary, for prior art, the desired function of a die is defined by receiving the control signal via the corresponding pin. However, in the present invention, a die can be defined to perform one function by not connecting the switching pad of the die to any pin and to perform another function by connecting the switching pad of the die to the base via the down bond wire. Hence, during packaging the integrated circuit, at least one pin can be omitted to lower the cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit using down bond to define functions of a die, comprising:
   a die, which has at least a first function and a second function, comprising a plurality of signal pads and at least a switching pad, wherein the die receives and outputs signals through the signal pads, and the switching pad is for switching the functions of the die;
   a base for supporting the die;
   a covering material for covering the die and the base; and
   a plurality of pins, wherein one terminal of each pin is inside the covering material and coupled to the corresponding signal pad, and the other terminal of each pin is outside the covering material, and the signal pads are connected to the circuits outside the integrated circuit through the pins;
   wherein, when the switching pad is connected to the base through a down bond wire, the die performs the first function.

2. The integrated circuit of claim 1, wherein the covering material is a thermoset seal.

3. The integrated circuit of claim 1, wherein the covering material is a plastic shell.

4. The integrated circuit of claim 1, wherein the signal pads are not electrically connected to the base.

* * * * *

UNITED STATES PATENT AND TRADEMARK OFFICE
CERTIFICATE OF CORRECTION

PATENT NO.         : 7,719,027 B2
APPLICATION NO.    : 11/625810
DATED              : May 18, 2010
INVENTOR(S)        : ShouFang Chen It is certified that error appears in the above-identified patent and that said Letters Patent is hereby corrected as shown below:

On the title page, item (54), correct the invention title from "INTERGRATED CIRCUIT UTILIZING DOWN BOND TO DEFINE THE FUNCTION OF THE DIE AND THE IMPLEMENTING METHOD THEREOF" to -- INTEGRATED CIRCUIT UTILIZING DOWN BOND TO DEFINE THE FUNCTION OF THE DIE AND THE IMPLEMENTING METHOD THEREOF --.

Signed and Sealed this

Third Day of August, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,719,027 B2 | Page 1 of 1 |
| APPLICATION NO. | : 11/625810 | |
| DATED | : May 18, 2010 | |
| INVENTOR(S) | : ShouFang Chen | |

It is certified that error appears in the above-identified patent and that said Letters Patent is hereby corrected as shown below:

On the title page, item (54) and at Column 1, lines 1-4, correct the invention title from "INTERGRATED CIRCUIT UTILIZING DOWN BOND TO DEFINE THE FUNCTION OF THE DIE AND THE IMPLEMENTING METHOD THEREOF" to -- INTEGRATED CIRCUIT UTILIZING DOWN BOND TO DEFINE THE FUNCTION OF THE DIE AND THE IMPLEMENTING METHOD THEREOF --.

This certificate supersedes the Certificate of Correction issued August 3, 2010.

Signed and Sealed this

Twenty-fourth Day of August, 2010

David J. Kappos
*Director of the United States Patent and Trademark Office*